US011711933B2

(12) United States Patent
Adamovich et al.

(10) Patent No.: US 11,711,933 B2
(45) Date of Patent: *Jul. 25, 2023

(54) OLED DEVICE STRUCTURES

(71) Applicant: Universal Display Corporation, Ewing, NJ (US)

(72) Inventors: Vadim Adamovich, Yardley, PA (US); Michael Stuart Weaver, Princeton, NJ (US); Nicholas J. Thompson, New Hope, PA (US)

(73) Assignee: Universal Display Corporation, Ewing, NJ (US)

(*) Notice: Subject to any disclaimer, the term of this patent is extended or adjusted under 35 U.S.C. 154(b) by 277 days.

This patent is subject to a terminal disclaimer.

(21) Appl. No.: 16/680,929

(22) Filed: Nov. 12, 2019

(65) Prior Publication Data
US 2020/0083471 A1 Mar. 12, 2020

Related U.S. Application Data

(62) Division of application No. 15/589,291, filed on May 8, 2017, now Pat. No. 10,522,776.
(Continued)

(51) Int. Cl.
*H01L 51/50* (2006.01)
*H01L 51/00* (2006.01)
(Continued)

(52) U.S. Cl.
CPC ............. *H10K 50/13* (2023.02); *H10K 50/11* (2023.02); *H10K 85/342* (2023.02); *H10K 85/615* (2023.02); *H10K 85/622* (2023.02); *H10K 85/631* (2023.02); *H10K 85/654* (2023.02); *H10K 85/657* (2023.02); *H10K 85/6576* (2023.02); *H10K 2101/30* (2023.02); *H10K 2101/40* (2023.02); *H10K 2101/90* (2023.02); *H10K 2102/321* (2023.02)

(58) Field of Classification Search
CPC ................ C09K 11/06; H01L 51/5036; H01L 2251/5384; H01L 2251/552
See application file for complete search history.

(56) References Cited

U.S. PATENT DOCUMENTS 4,769,292 A  9/1988 Tang
5,247,190 A  9/1993 Friend
(Continued)

FOREIGN PATENT DOCUMENTS

WO  2008057394 A1  5/2008
WO  2010011390 A2  1/2010

OTHER PUBLICATIONS

Baldo et al. Highly efficient phosphorescent emission from organic electroluminescent devices, Nature, vol. 395, pp. 151-154, 1998.
(Continued)

*Primary Examiner* — Julio J Maldonado
*Assistant Examiner* — Stanetta D Isaac
(74) *Attorney, Agent, or Firm* — Butzel Long

(57) ABSTRACT

Devices having multiple multicomponent emissive layers are provided, where each multicomponent EML includes at least three components. Each of the components in each EML is a host material or an emitter. The devices have improved color stability and relatively high luminance.

37 Claims, 10 Drawing Sheets

Related U.S. Application Data

(60) Provisional application No. 62/340,139, filed on May 23, 2016, provisional application No. 62/356,254, filed on Jun. 29, 2016.

(51) Int. Cl.
*H10K 50/13* (2023.01)
*H10K 50/11* (2023.01)
*H10K 101/40* (2023.01)
*H10K 85/30* (2023.01)
*H10K 85/60* (2023.01)
*H10K 101/30* (2023.01)
*H10K 101/00* (2023.01)
*H10K 102/00* (2023.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0046495 A1* | 3/2004 | Peng ............... H05B 33/14 313/504 |
| 2004/0174116 A1 | 9/2004 | Lu |
| 2005/0280008 A1* | 12/2005 | Ricks ............... H01L 51/5036 257/79 |
| 2014/0084269 A1 | 3/2014 | Weaver |
| 2015/0295198 A1 | 10/2015 | Xu |
| 2016/0181560 A1 | 6/2016 | Yamamoto |

OTHER PUBLICATIONS

Baldo, et al., "Very high-efficiency green organic light-emitting devices based on electrophosphorescence", Applied Physics Letters, Jul. 5, 1999, 4 pp , vol. 75, No. 1, American Institute of Physics, Melville, NY, USA.

* cited by examiner

FIG. 5
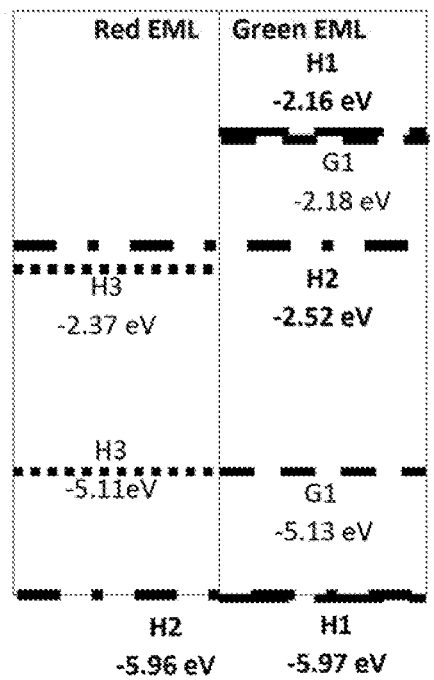
FIG. 7
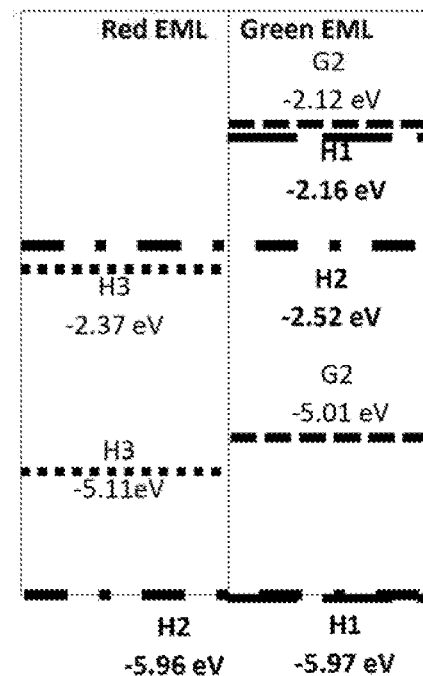
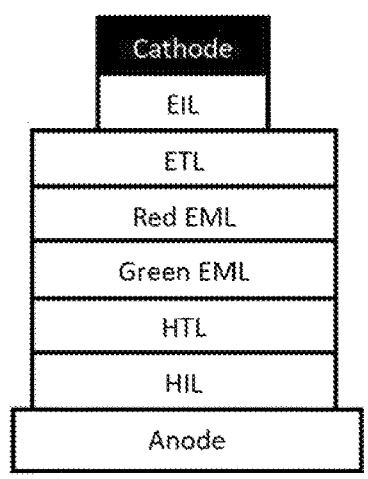
FIG. 10
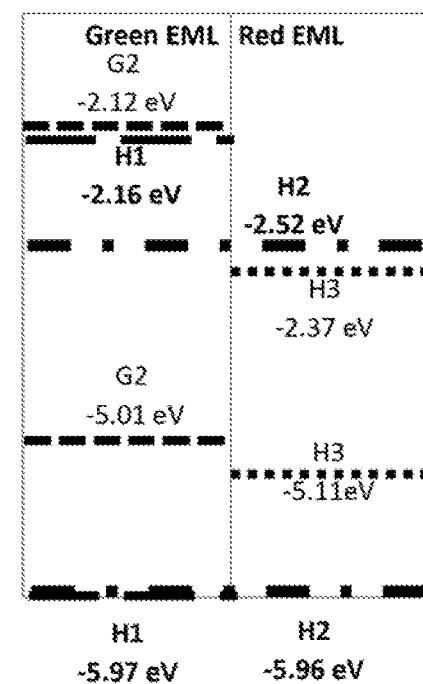
FIG. 11

FIG. 13
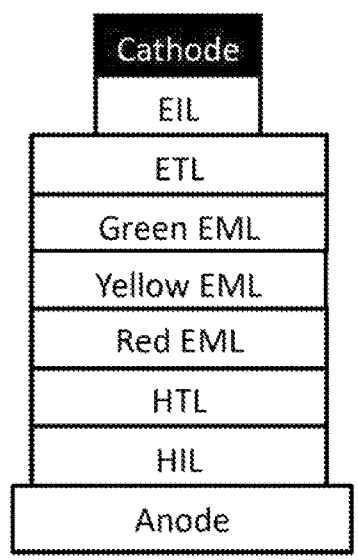
FIG. 14
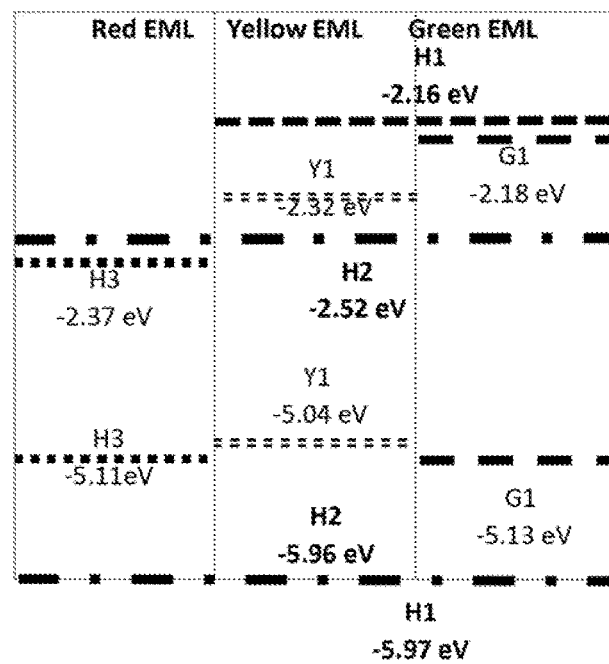
FIG. 16
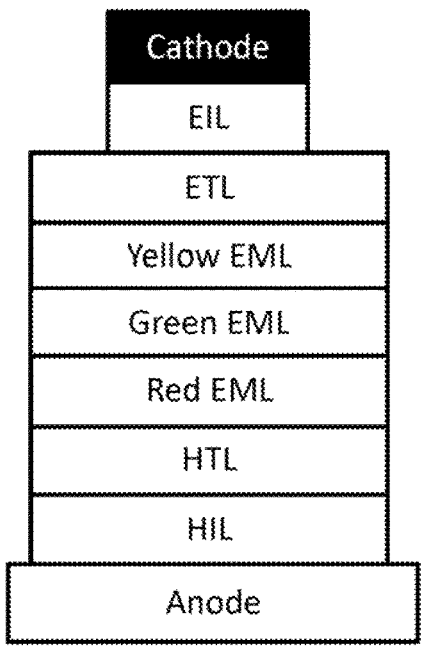
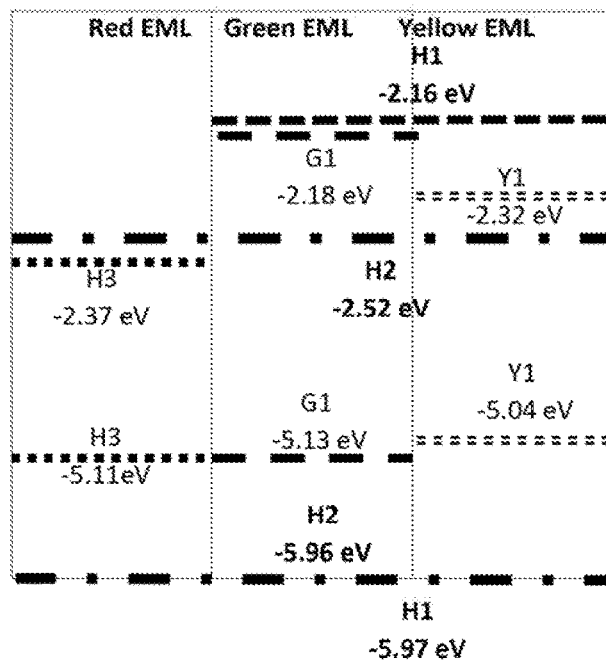
FIG. 17

OLED DEVICE STRUCTURES

CROSS-REFERENCE TO RELATED APPLICATIONS

This application is a non-provisional and claims the priority benefit of U.S. Provisional Patent Application Ser. Nos. 62/340,139, filed May 23, 2016 and 62/356,254, filed Jun. 29, 2016, the entire contents of each of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to emissive layers having more than two components and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

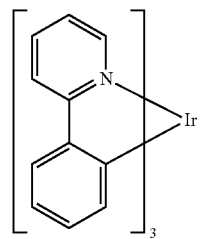

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a device such as an OLED is provided that includes a first electrode, a second electrode, a first emissive layer disposed between the first electrode and the second electrode, which includes at least three components, each being a first host material, a second host material, a first emissive material, or a second emissive material. A second emissive layer disposed between the first electrode and the second electrode and in direct physical contact with the first emissive layer similarly may include at least three components, each of which is a third host material, a fourth host material, a third emissive material, or a fourth emissive material. The first emissive layer may have a thickness of not more than 30-70% of the thickness of the second emissive layer. In an arrangement, the first emissive layer may include two host materials, where the highest occupied molecular orbital (HOMO) of the first host material is within 15% or 0.8 eV of the HOMO of the second host material. Alternatively or in addition, the lowest unoccupied molecular orbital (LUMO) of the first host material may be within 35% or 0.8 eV of the LUMO of the second host material. The first emissive layer may include a first host material, a second host material different than the first host material, and an emissive material. Alternatively or in addition, the second emissive layer may include a third host material and a fourth host material different than the first host material, and a second emissive material. The third and fourth host materials may be the same as or different than the first and second host materials. In some cases, the emissive layers may include the same host materials and/or the same emissive materials, but in different relative concentrations. In an example arrangement, the first emissive layer may include first and second host materials and a red emissive material, and the second emissive layer may include two host materials, one of which includes the first host material, and a green emissive material. The device may include a third multicomponent emissive layer. The third emissive layer may include multiple host and/or emissive materials, which may be the same as or different than any of the host and emissive materials in the first and second emissive layers. The device may emit any desired color of light, including white light, when operated. Each host and/or emissive material in each emissive layer may include an organic compound, metal complex, or combinations thereof. Each emissive layer may comprise multiple host materials in various relative amounts. For example, an emissive layer may include two host materials at a ratio in the range of 5-95%, 5-50%, 30-40%, or the like. Similarly, multiple emissive materials may be used at a ratio in the range of 1-25%, 0.1-10%, 5-30%, or the like. The multicomponent EMLs in the device may jointly produce any desired color of light, including yellow light, when the device is operated. For example, the first and second emissive layers jointly produce light for which at least 25% of the total integrated intensity is at a wavelength of 500-600 nm. As another example, the first and second emissive layers may jointly produce light for which at least 25% of the total integrated intensity is at a wavelength of 600-750 nm. Any of the emissive materials may be phosphorescent, or may emit light using any other known mechanism including TDAF, fluorescence, and the like. Each emissive material may be an organic material, an organometallic compound, or a combination thereof.

In an embodiment, a consumer electronic product is provided that includes an OLED as previously disclosed, including at least two multicomponent emissive layers. The product may be, for example, a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, a sign, or the like.

In an embodiment, a method of fabricating a device is provided that includes fabricating a first emissive layer over a first electrode, the first emissive layer comprising at least three components, each independently selected from the group consisting of: a first host material, a second host material, a first emissive material, and a second emissive material; and fabricating a second emissive layer over [and immediately adjacent to the first emissive layer], the second emissive layer comprising at least three components, each independently selected from the group consisting of: a third host material, a fourth host material, a third emissive material, and a fourth emissive material.

BRIEF DESCRIPTION OF THE DRAWINGS

FIG. 5 shows an energy level diagram (not to scale) of an example R/G structure with a G1 green emitter according to an embodiment of the invention.

FIG. 7 shows an energy level diagram (not to scale) of an example R/G structure with a G2 green emitter according to an embodiment of the invention.

FIG. 10 shows an example G/R device structure according to an embodiment of the invention.

FIG. 11 shows an energy level diagram (not to scale) of an example G/R structure with a G2 green emitter according to an embodiment of the invention.

FIG. 13 shows an example R/Y/G device structure according to an embodiment of the invention.

FIG. 14 shows an energy level diagram (not to scale) for an example R/Y/G structure with a G1 green emitter according to an embodiment of the invention.

FIG. 16 shows an example R/G/Y device structure according to an embodiment of the invention.

FIG. 17 shows an energy level diagram (not to scale) of an example R/G/Y structure with a G1 green emitter according to an embodiment of the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
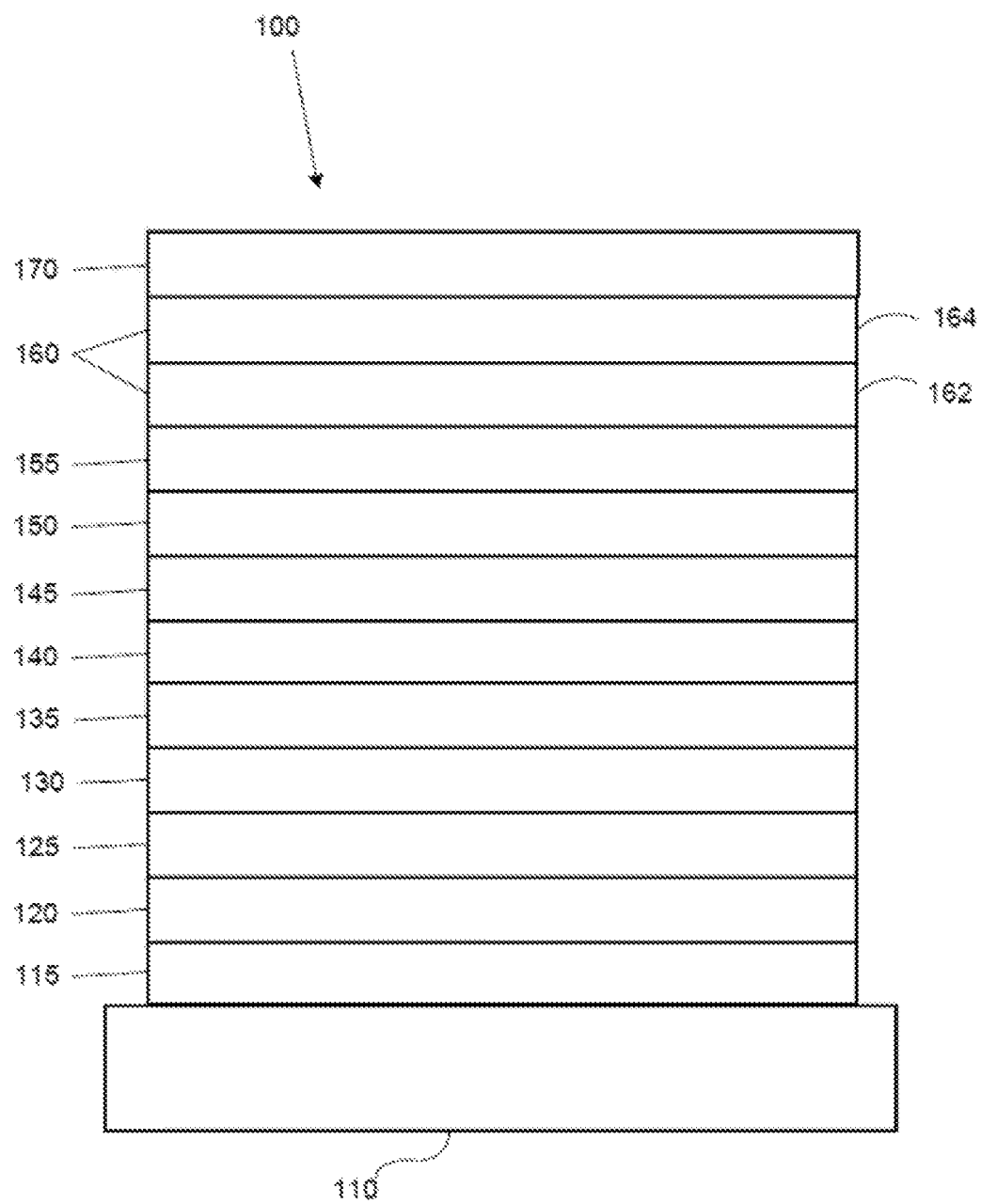
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
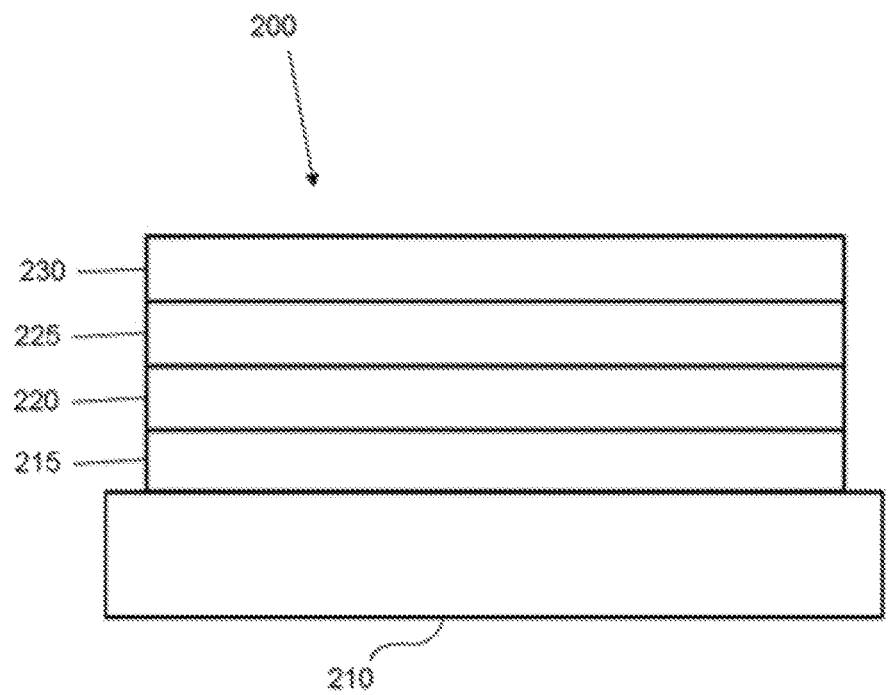
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical, vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays less than 2 inches diagonal, 3-D displays, virtual reality or augmented reality displays, vehicles, video walls comprising multiple displays tiled together, theater or stadium screens, and signs. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

OLEDs often contains more than one emissive layer. For example, a white OLED may contain two to six emissive layers. The yellow stack of a hybrid white OLED may include several red, yellow and/or green emissive layers. In turn, each of these layers may include one or more emitters, i.e., materials that produce the initial light within the layer. In such devices, it may be desirable to position the recombination zone at the interface of adjacent emissive layers. This may achieve color stability at various driving conditions, while maintaining a relatively high-efficiency, long-operating lifetime and color stability resistance to aging. However, even in an optimized arrangement, a multi-layer OLED device often will exhibit a color that varies with different driving currents. This illustrates that the color stability of the device needs improvement.

Devices with multicomponent EMLs often provide superior performance in terms of voltage, efficiency and lifetime in contrast to two-component containing EMLs. A "multicomponent EML" is an emissive layer that includes more than two components. For example, a multicomponent EML may include two host-type compounds and an emitter combination (e.g. a hole transporting cohost (h-host), an electron transporting cohost (e-host), and a compound capable of functioning as an emitter in an OLED at room temperature). More generally, a multicomponent EML can include a structure such as a Host:Host 2:Emitter structure, a Host:Emitter 1:Emitter 2 structure, or the like. In contrast, a two-component EML contains only two components, typically a host and an emitter.

As disclosed herein, it has been unexpectedly found that two- and three-EML stack structures, in which each EML is a multicomponent EML, may provide improved color stability and luminance. This result would be unexpected to one of skill in the art because typically multicomponent EML devices have very unstable color peaks, especially in response to changes in luminance or aging of the device. Devices disclosed herein may provide color stability to the device, with relatively little or no shift of the recombination zone within the device due to aging or luminance changes. Designs for color-stable multi-EML devices are provided based on energy levels of emissive and charge transport materials in both EMLs, the nature of the host(s) and emitters, concentrations of the components, and layer thicknesses. Preferred or optimized structures often may position the recombination zone at the interface of the emissive layers. The very color-stable multiple-layer structures disclosed herein can be used in bottom emission, bottom emission microcavity, transparent, top emission and top emission micorcavity structures. They also may be applied as a component, such as a yellow component, in conjunction with one or more other components, to provide color-stable OLED devices. For example, a yellow-emitting component may be used in tandem with a blue-emitting stack. or in a stacked white OLED.

The energy levels (HOMO-LUMO), and T1 levels of example emissive layer materials disclosed herein are shown in Table 1. Energy levels are shown for three host materials H1, H2, H3, two green emitters G1, G2, a red emitter R1, and a yellow emitter Y1.

TABLE 1

HOMO, LUMO and T1 of example EML materials

| Material | HOMO [eV] | LUMO [eV] | T1 [eV] |
| --- | --- | --- | --- |
| H1 | −5.97 | −2.16 | 2.64 |
| H2 | −5.96 | −2.52 | 2.56 |
| H3 | −5.11 | −2.37 | 2.31 |
| G1 | −5.13 | −2.18 | 2.42 |
| G2 | −5.01 | −2.12 | 2.44 |
| R1 | −5.07 | −2.51 | 2.12 |
| Y1 | −5.04 | −2.32 | 2.32 |

The HOMO levels are obtained from the oxidation onset by cyclic voltammetry (Eox by CV), the LUMO levels are obtained from the reduction onset by cyclic voltammetry (Ered by CV), and the T1 levels are obtained from solution photoluminescence (PL) at 77 K.

An organic layer that emits a particular color as disclosed herein may include one or multiple emitters, i.e., emissive materials within the layer, although generally the layer as a whole will emit only a single color. That is, each emissive layer within a device or arrangement as disclosed herein may emit, when activated, only one of two colors, even in configurations in which the layer includes multiple emitters.

Embodiments disclosed herein are not limited to device containing only red, yellow and green emitters. Other combinations of emitters in a multiple multicomponent EML arrangement as disclosed are possible. For example, blue (B)/green(G), yellow (Y)/red(R), R/Y, G/B, B/R, R/B, G/Y, Y/G, R/Y/G, R/G/Y, Y/G/R, G/Y/R, Y/R/G, and the like. The examples provided herein are described with phosphorescent emitters. However, fluorescent and thermally activated delayed fluorescence (TADF) emitters also may be used instead of, or in conjunction with, the examples explicitly provided herein.

Figure 3:
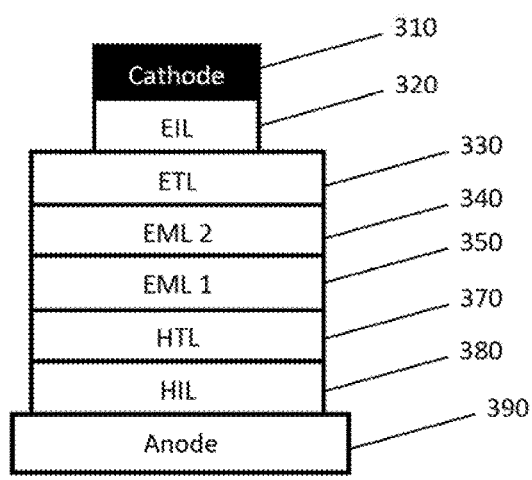
FIG. 3 shows a schematic representation of an example device structure according to an embodiment of the invention.

FIG. 3 shows an example device structure according to embodiments disclosed herein. Two multicomponent emissive layers 340, 350 are disposed between two electrodes 310, 390. Each multicomponent EML includes at least three components, with each component being either a host material (host) or an emissive material (emitter). The two multicomponent EMLs may have the same or different combinations of hosts and emitters. For example, EML 1 (340) may include two hosts and a single emitter, while EML 2 (350) may include a single host with multiple emitters. Typically, although each multicomponent EML may have the same combination of types of components, i.e., the same ratio of hosts to emitters, the specific materials in each layer are not the same. The multicomponent EMLs 340, 350 generally are disposed immediately above or below one another within the stack of the device, i.e., in direct physical contact with each other and without intervening layers such as charge generation layers, injection or blocking layers, or the like. This allows for the multicomponent EMLs to be structured such that the recombination zone is positioned near or at the interface of one multicomponent EML with another. The device may include additional layers such as injection layers 320, 380, transport layers 330, 370, or the like. More generally, any of the types of layers disclosed herein with respect to FIGS. 1 and 2 may be present in the device.

As shown in the specific examples provided below, the multiple multicomponent EMLs within a device may have different physical properties, which may be chosen to result in specific relationships between the EMLs in the device. For example, the multicomponent EMLs may have different thicknesses. In some embodiments, it may be preferred for one multicomponent EML to have a thickness of 30-70% of another multicomponent EML in the same device. Similarly, materials may be used in a single multicomponent EML or in multiple multicomponent EMLs in a device to achieve specific relationships among the different energy levels of each multicomponent EML or components thereof. For example, in a multicomponent EML having multiple host materials, it may be preferred for the HOMO of one host material to be within about 0.8 eV or, more generally, within about 15% of the HOMO of another host material in the EML. Alternatively or in addition, it may be preferred for the LUMO of one host material to be within about 0.8 eV or, more generally, about 35% of the LUMO of another host material in the EML.

In some embodiments, multicomponent EMLs within a device may share one or more components, although in general the total composition of EMLs within the device will be different. For example, two multicomponent EMLs in a device may each include the same two host materials, but in different relative concentrations. As another example, two multicomponent EMLs in a device may include the same host materials in the same or different relative concentrations and different emissive materials. As another example, two multicomponent EMLs in a device may include one host material that is the same in each EML, one host material that is different, and the same or different emissive materials. More generally, any of the components within each multicomponent EML in a device may be the same or different than the components in any other multicomponent EML in a device, although generally no two multicomponent EMLs that are in direct physical contact with one another within a single device will have identical compositions, i.e., the same components in the same ratios.

In some embodiments, an additional emissive layer may be present in the device, which may or may not be a multicomponent emissive layer. For example, an additional emissive layer may be used so that the device can emit white light overall. That is, while in general embodiments disclosed herein with two multicomponent EMLs will not be white-emitting devices, such a device may be achieved by including one or more additional emissive layers.

The same-type components in a multicomponent EML may be present in equal amounts, or across a range of ratios. For example, the ratio of one emitter to another, by weight, of a multicomponent EML that includes multiple emitters may be in a range of 5-95%, 5-50%, 30-40%, or any other suitable range. As another example, different emitters in a multicomponent EML may be present in equal amounts, or the ratio of one emitter to another may be in the range of 1-25%, 0.1-10%, 5-30%, or any other suitable range. Similar ranges may be used for the ratio of an emitter in one multicomponent EML to another or the same emitter in a different EML within the device.

As shown in the examples below, one or more multicomponent EMLs within a device may individually or in conjunction with one another produce a range of colors of light. For example, two multicomponent EMLs within a single device may jointly produce yellow light, although neither EML by itself would produce yellow light if it were it to be operated in the same device without the other EML being present. Similarly, each individual multicomponent EML within a device may produce blue, green, red, cyan, yellow, or any other desired color, although the combined light produced by the individual EML and one or more other multicomponent EMLs may be of a different color.

DEVICE EXAMPLES

All example devices described herein were fabricated by high vacuum ($10^{-7}$ Torr or less) thermal evaporation. The anode electrode was 750 Å of indium tin oxide (ITO). The cathode was 10 Å of Liq (8-hydroxyquinoline lithium) followed by 1,000 Å of Al. All devices were encapsulated with a glass lid sealed with an epoxy resin in a nitrogen glove box (less than 1 ppm of $H_2O$ and $O_2$) immediately after fabrication with a moisture getter incorporated inside the package. The organic stack of each example device included a structure as shown in FIG. 3 with, sequentially from the ITO surface: 100 Å of HAT-CN as the hole injection layer (HIL); 450 Å of HTM as a hole transporting layer (HTL); and 2-3 emissive layers (EMLs) with total thickness 400 Å in R/G, G/R, R/Y/G, Y/G/Y combinations as described. The red emissive layer included a host H2, cohost H3 and red emitter R1 with a maximum emission wavelength ~628 nm). The green emissive layer included H-host (H1):E-host (H2) in variable ratio and a green emitter G1 (maximum emission wavelength ~530 nm) or G2 (maximum emission wavelength ~536 nm), with G1 and G2 belonging to different families of emitters. The yellow emissive layer contained H-host (H1):E-host (H2) in variable ratio and a yellow emitter Y1 (maximum emission wavelength ~558 nm). Each device also included 350 Å of Liq (8-hydroxyquinoline lithium) doped with 40% of ETM as the ETL. The chemical structures of the device materials are shown below.

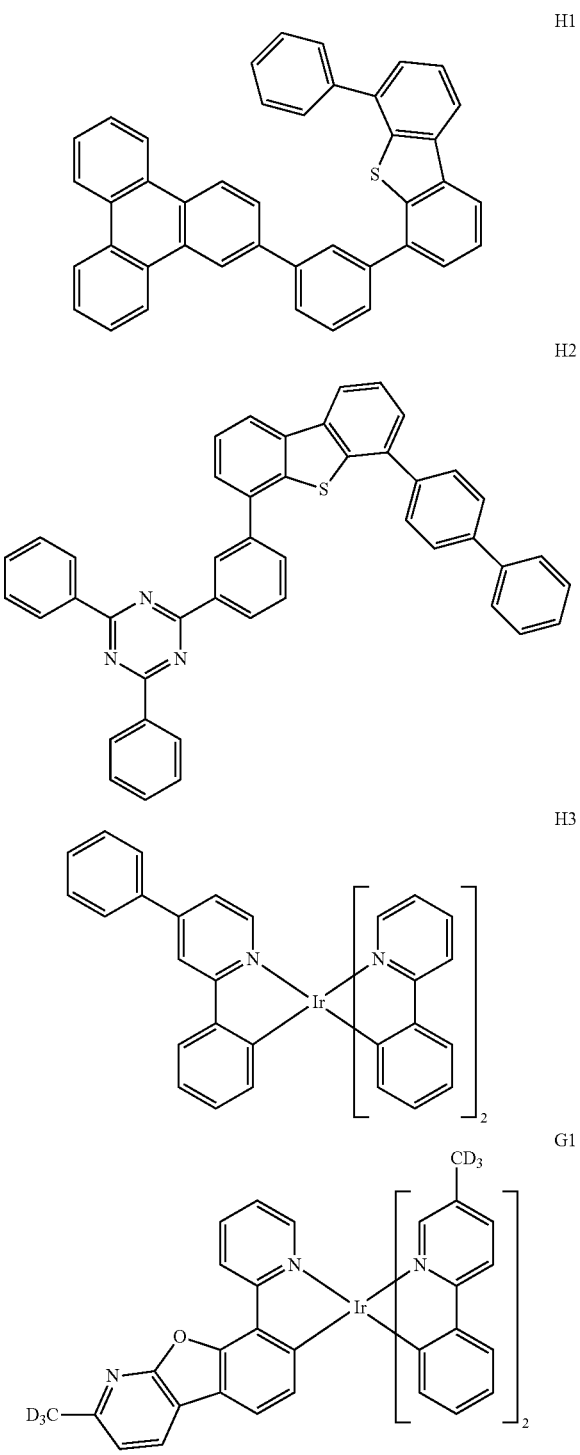

G2
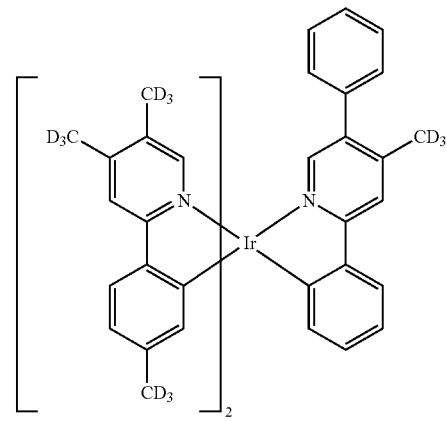

R1
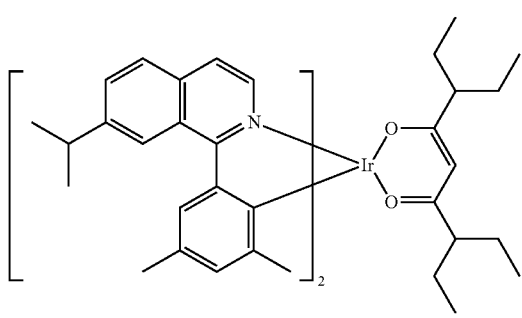

Y1
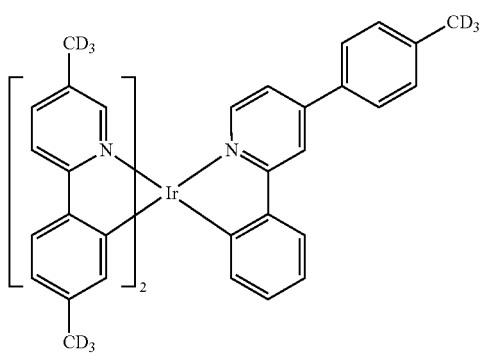

HATCN
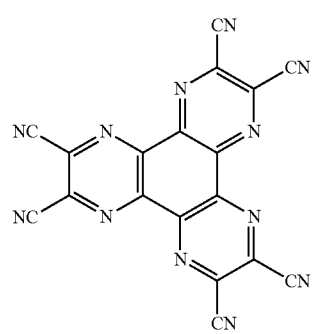

HTM
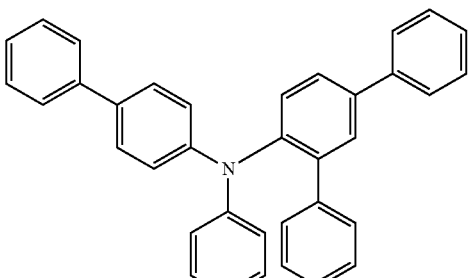

ETM
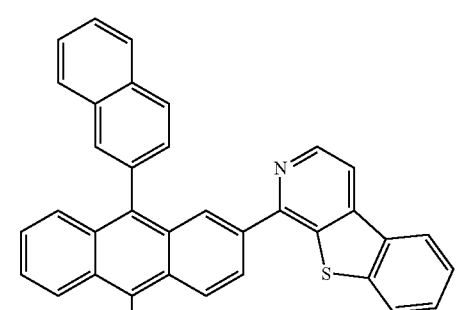

Liq
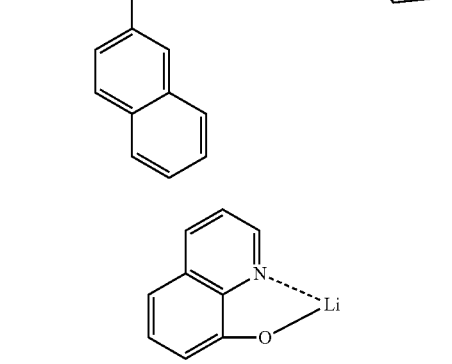

After fabrication the electroluminescence (EL), current/voltage/luminance (JVL) and lifetime at DC 80 mA/cm² of each device were tested. The red/green peak ratio was measured as a merit of color indicating the emission from both EMLs. The color stability to various driving current densities was measured at 1, 10, and 100 mA/cm² and ratio of R/G peaks at 100 to 1 mA/cm² was used as a merit of color stability vs. luminance. A value of 100% means that the color does not change with current density from 1 to 100 mA/cm². If this value is less than 100%, green contribution to emission increases with luminance increase. Conversely, values greater than 100% indicate that red contribution to the EL increases with luminance increase.

The device EL was measured upon aging to approximately 95% and R/G peaks ratio aged/non aged devices was measured. The results are shown in the performance table. Values less than 100% indicate that red degrades faster than green (and/or yellow). Values greater than 100% indicate that green (and/or yellow) degrades faster than red. A schematic HOMO-LUMO diagram is also shown for EML materials as indicated to further explain the device properties. Red emitter energy levels are omitted from the diagrams since it is believed that the red emitter does not transport significant charge at the used concentration level (2%) and most charge is carried by host materials and green emitters.

Figure 4:
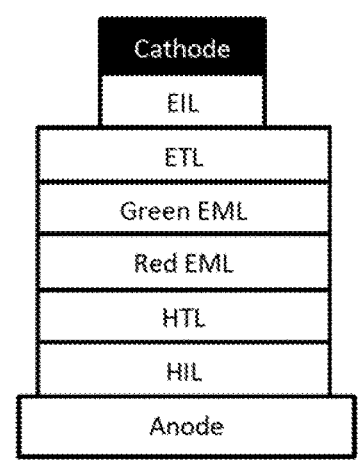
FIG. 4 shows an example R/G device structure according to an embodiment of the invention.
Figure 6:
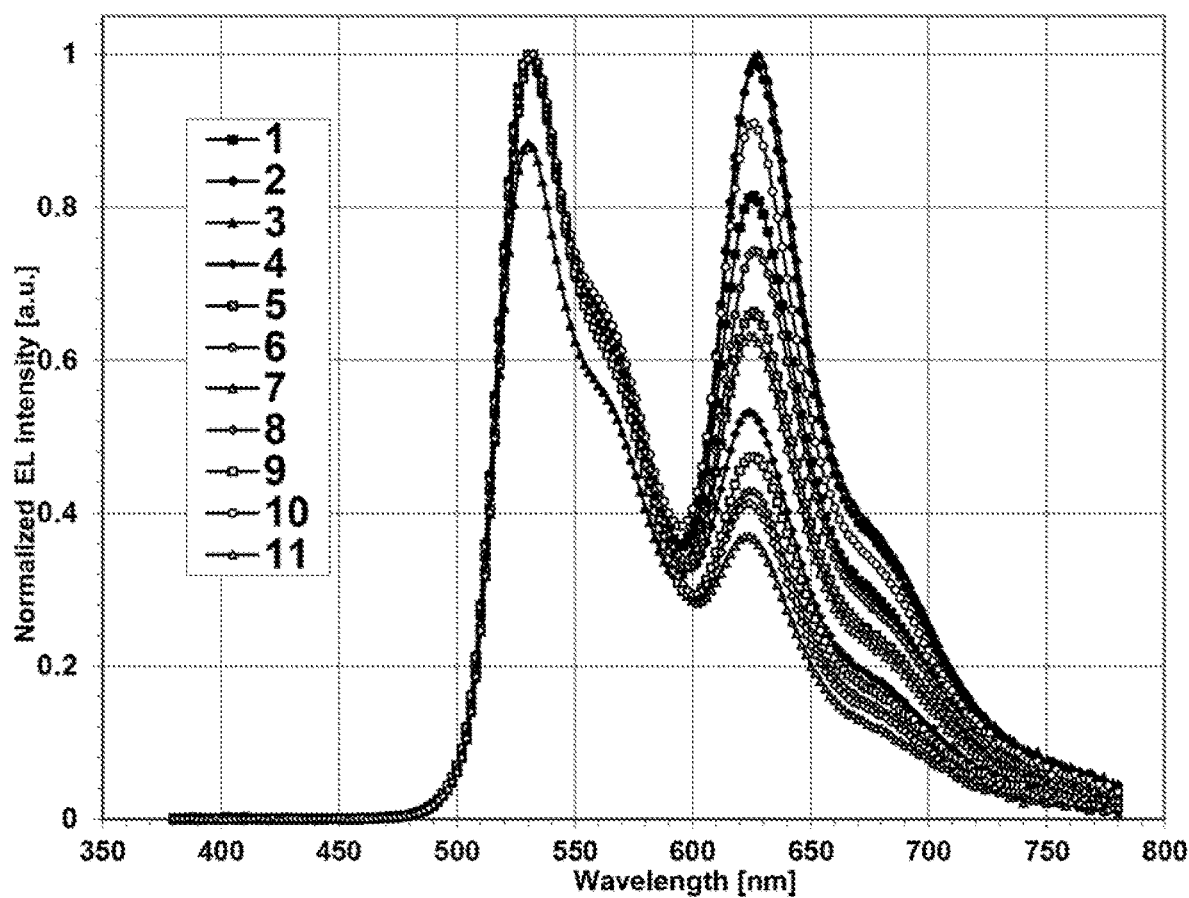
FIG. 6 shows a normalized EL spectra of an example R/G structure with a G1 green emitter according to an embodiment of the invention.

FIG. 4 shows the schematic structure for a device having red and green multicomponent emissive layers with G1 as a green emitter. Table 2 shows the device layer thickness and materials, and FIG. 5 shows the energy level diagrams of the EML materials. The structure variations and device performance is shown in Tables 3A and 3B. The normalized EL spectra are shown in FIG. 6.

TABLE 2

The device layer thickness and materials for R/G structures with G1 as a green Emitter.

| Layer | Material | Thickness [Å] |
|---|---|---|
| Anode | ITO | 750 |
| HIL | HAT-CN | 100 |
| HTL | HTM | 450 |
| Red EML | H2:H3 35%:R1 2% | 25, 50, 75 |
| Green EML | H1:H2:G1 | 325, 350, 375 |
| ETL | Liq:ETM 40% | 350 |
| EIL | Liq | 10 |
| Cathode | Al | 1,000 |

TABLE 3A

Structure and performance of R/G structures with G1 green emitter:

| Example | Red EML [Å] | Green EML [Å] | H1:H2 Ratio | G1 [%] | x | y | $\lambda$ max [nm] | FWHM [nm] | R/G Peak ratio |
|---|---|---|---|---|---|---|---|---|---|
| 1 | 25 | 375 | 3:2 | 10 | 0.440 | 0.541 | 530 | 63 | 0.81 |
| 2 | 50 | 350 | 3:2 | 10 | 0.454 | 0.528 | 530 | 63 | 0.98 |
| 3 | 75 | 325 | 3:2 | 10 | 0.464 | 0.518 | 627 | 55 | 1.12 |
| 4 | 25 | 375 | 3:2 | 12 | 0.414 | 0.566 | 531 | 63 | 0.53 |
| 5 | 50 | 350 | 3:2 | 12 | 0.426 | 0.554 | 531 | 62 | 0.66 |
| 6 | 75 | 325 | 3:2 | 12 | 0.433 | 0.547 | 531 | 61 | 0.74 |
| 7 | 25 | 375 | 3:2 | 15 | 0.395 | 0.584 | 532 | 61 | 0.37 |
| 8 | 50 | 350 | 3:2 | 15 | 0.401 | 0.578 | 532 | 61 | 0.43 |
| 9 | 75 | 325 | 3:2 | 15 | 0.406 | 0.574 | 532 | 60 | 0.47 |
| 10 | 25 | 375 | 1:1 | 10 | 0.449 | 0.533 | 531 | 65 | 0.91 |
| 11 | 25 | 375 | 1:1 | 12 | 0.425 | 0.556 | 531 | 63 | 0.63 |
| 12 | 25 | 375 | 1:1 | 15 | 0.400 | 0.579 | 532 | 61 | 0.41 |

TABLE 3B

Structure and performance of R/G structures with G1 green emitter:

| | At 10 mA/cm2 | | | At 80 mA/cm2 | | 100 vs. 1 mA/cm2 R/G ratio | | Aged vs. nonaged R/G ratio | |
|---|---|---|---|---|---|---|---|---|---|
| Example | Voltage [V] | LE [cd/A] | EQE [%] | Lo [nits] | $LT_{95\%}$ [h] | $\Delta$ u'v' | change [%] | $\Delta$ u'v' | change [%] |
| 1 | 4.7 | 53.2 | 21.8 | 30,369 | 91 | 0.029 | 61% | | |
| 2 | 4.7 | 50.3 | 22.3 | 29,447 | 110 | 0.029 | 65% | 0.008 | 88% |
| 3 | 4.7 | 47.8 | 22.5 | 28,843 | 127 | 0.025 | 71% | 0.007 | 89% |
| 4 | 4.6 | 62.9 | 22.3 | 36,942 | 100 | 0.012 | 78% | 0.004 | 91% |
| 5 | 4.6 | 59.1 | 22.8 | 35,654 | 116 | 0.010 | 83% | 0.004 | 93% |
| 6 | 4.5 | 56.2 | 22.7 | 34,629 | 112 | 0.007 | 88% | 0.004 | 92% |
| 7 | 4.5 | 72.1 | 23.2 | 44,195 | 105 | 0.003 | 95% | 0.002 | 95% |
| 8 | 4.5 | 69.6 | 23.5 | 43,339 | 115 | 0.001 | 100% | 0.002 | 95% |
| 9 | 4.5 | 67.4 | 23.5 | 42,514 | 175 | 0.002 | 106% | 0.002 | 96% |
| 10 | 4.5 | 49.4 | 21.0 | 27,749 | 74 | 0.036 | 56% | 0.002 | 97% |
| 11 | 4.4 | 58.0 | 21.8 | 34,033 | 91 | 0.020 | 68% | 0.001 | 98% |
| 12 | 4.3 | 67.0 | 22.3 | 40,755 | 88 | 0.005 | 88% | | |

In this example, it was found that for the G1 green emitter (Aza-DBF family), the red peak moved down with increasing current, due to the recombination zone spreading farther away from the interface as the current increased. A higher relative concentration of the G1 emitter in the G EML was found to improve the color stability to both current density and aging. It is believed that this is the result of fewer holes moving away from the interface between the multicomponent EMLs. Increasing the red EML was also found to improve color stability, whereas increasing the portion of E-host in the green EML was found to decrease the color stability. It is believed that the latter results from a greater number of electrons moving toward the interface.

Figure 8:
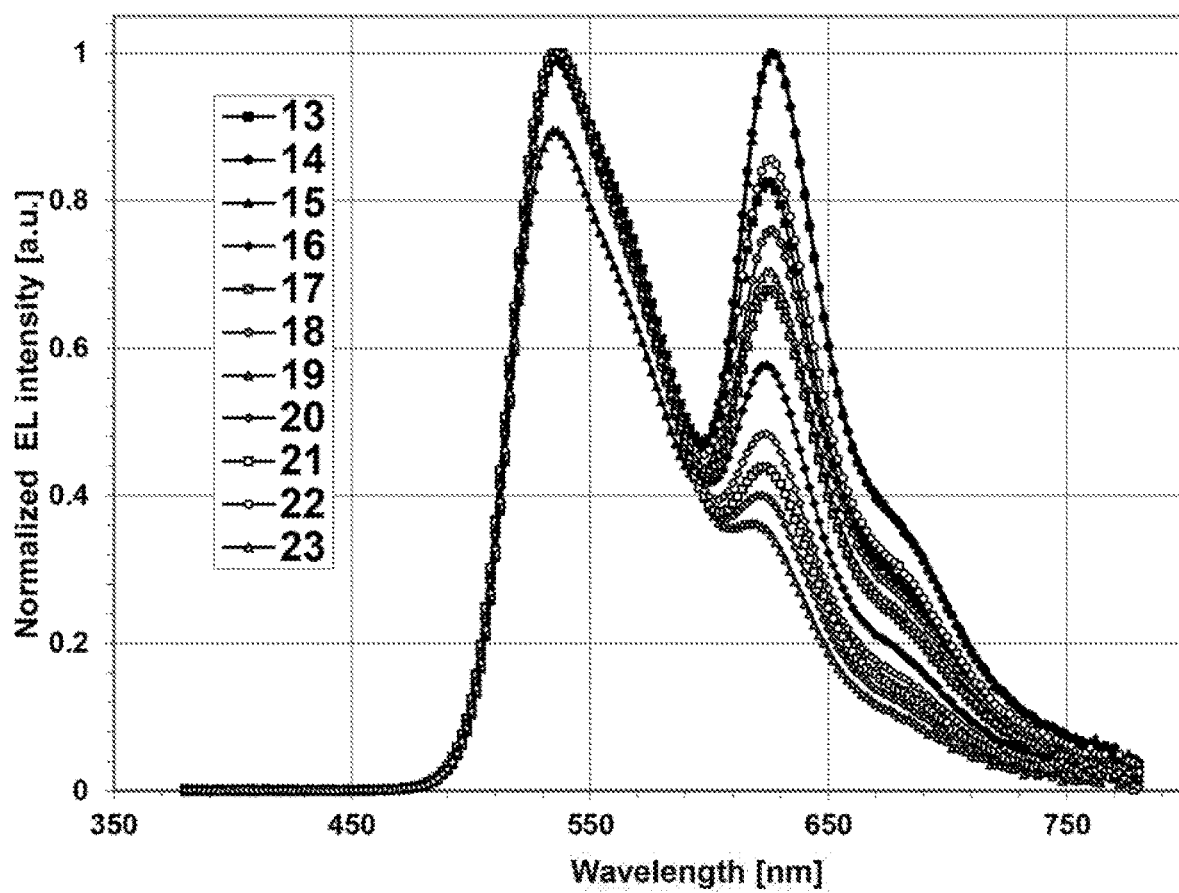
FIG. 8 shows a normalized EL spectra of an example R/G structure with a G2 green emitter according to an embodiment of the invention.

The same structure was used to fabricate a similar device, but using G2 as the green emitter. Table 4 shows the device layer thickness and materials and FIG. 7 shows energy level diagrams. Tables 5A and 5B show the structure variation and device performance. The normalized EL spectra are shown in FIG. 8.

TABLE 4

The device layer thickness and materials for R/G structures with G2 as a green Emitter:

| Layer | Material | Thickness [Å] |
|---|---|---|
| Anode | ITO | 750 |
| HIL | HAT-CN | 100 |
| HTL | HT | 450 |
| Red EML | H2:H3 35%:R1 2% | 25, 50, 75 |
| Green EML | H1:H2:G2 | 325, 350, 375 |
| ETL | Liq:ETM 40% | 350 |
| EIL | Liq | 10 |
| Cathode | Al | 1,000 |

TABLE 5A

Structure and performance of R/G structures with G2 green emitter:

| Example | Red EML [Å] | Green EML [Å] | H1:H2 Ratio | G2 [%] | x | y | $\lambda$ max [nm] | FWHM [nm] | R/G Peak ratio |
|---|---|---|---|---|---|---|---|---|---|
| 13 | 25 | 375 | 3:2 | 10 | 0.441 | 0.540 | 536 | 77 | 0.83 |
| 14 | 50 | 350 | 3:2 | 10 | 0.453 | 0.528 | 627 | 74 | 1.01 |
| 15 | 75 | 325 | 3:2 | 10 | 0.460 | 0.522 | 627 | 68 | 1.12 |
| 16 | 25 | 375 | 3:2 | 12 | 0.420 | 0.560 | 536 | 74 | 0.59 |
| 17 | 50 | 350 | 3:2 | 12 | 0.428 | 0.552 | 535 | 73 | 0.69 |
| 18 | 75 | 325 | 3:2 | 12 | 0.434 | 0.546 | 535 | 72 | 0.76 |
| 19 | 25 | 375 | 3:2 | 15 | 0.400 | 0.579 | 537 | 72 | 0.36 |
| 20 | 50 | 350 | 3:2 | 15 | 0.404 | 0.575 | 537 | 72 | 0.40 |
| 21 | 75 | 325 | 3:2 | 15 | 0.407 | 0.572 | 537 | 72 | 0.44 |
| 22 | 25 | 375 | 1:1 | 10 | 0.442 | 0.538 | 535 | 74 | 0.85 |
| 23 | 25 | 375 | 1:1 | 12 | 0.431 | 0.549 | 535 | 73 | 0.70 |
| 24 | 25 | 375 | 1:1 | 15 | 0.412 | 0.567 | 536 | 72 | 0.48 |

TABLE 5A

Structure and performance of R/G structures with G2 green emitter:

| | At 10 mA/cm2 | | | At 80 mA/cm2 | | 100 vs. 1 mA/cm2 | | Aged vs. nonaged | |
|---|---|---|---|---|---|---|---|---|---|
| Example | Voltage [V] | LE [cd/A] | EQE [%] | Lo [nits] | $LT_{95\%}$ [h] | $\Delta$ u'v' | R/G ratio change [%] | $\Delta$ u'v' | R/G ratio change [%] |
| 13 | 4.6 | 54.8 | 21.5 | 31,478 | 115 | 0.000 | 103% | 0.005 | 91% |
| 14 | 4.5 | 51.5 | 22.0 | 30,662 | 147 | 0.006 | 115% | 0.005 | 92% |
| 15 | 4.5 | 49.8 | 22.2 | 30,538 | 149 | 0.011 | 122% | 0.003 | 95% |
| 16 | 4.6 | 61.8 | 21.7 | 36,580 | 165 | 0.005 | 117% | 0.004 | 92% |
| 17 | 4.6 | 59.2 | 22.0 | 36,163 | 186 | 0.010 | 129% | 0.003 | 93% |
| 18 | 4.4 | 57.1 | 22.1 | 35,520 | 215 | 0.013 | 135% | 0.000 | 100% |
| 19 | 4.7 | 73.3 | 22.6 | 45,852 | 264 | 0.005 | 125% | 0.001 | 96% |
| 20 | 4.6 | 71.8 | 22.8 | 45,692 | 252 | 0.008 | 136% | 0.001 | 96% |
| 21 | 4.5 | 70.4 | 23.0 | 45,164 | 257 | 0.010 | 142% | 0.002 | 96% |
| 22 | 4.4 | 54.2 | 21.8 | 31,675 | 121 | 0.000 | 104% | 0.006 | 90% |
| 23 | 4.4 | 58.9 | 22.1 | 35,134 | 152 | 0.003 | 112% | 0.005 | 91% |
| 24 | 4.3 | 66.7 | 22.4 | 41,081 | 201 | 0.005 | 120% | 0.003 | 94% |

In this example, it was found that the red peak moves up as the current increased, and the recombination zone spreads toward the interface between multicomponent EMLs. It was also found that increasing the relative amount of the G2 green emitter in the green EML decreased the color stability as more holes move away from interface. A reduction in the thickness of the red EML increased the color stability, as did increasing the relative amount of E-host in the green EML as more electrons moved toward the interface.

Figure 9:
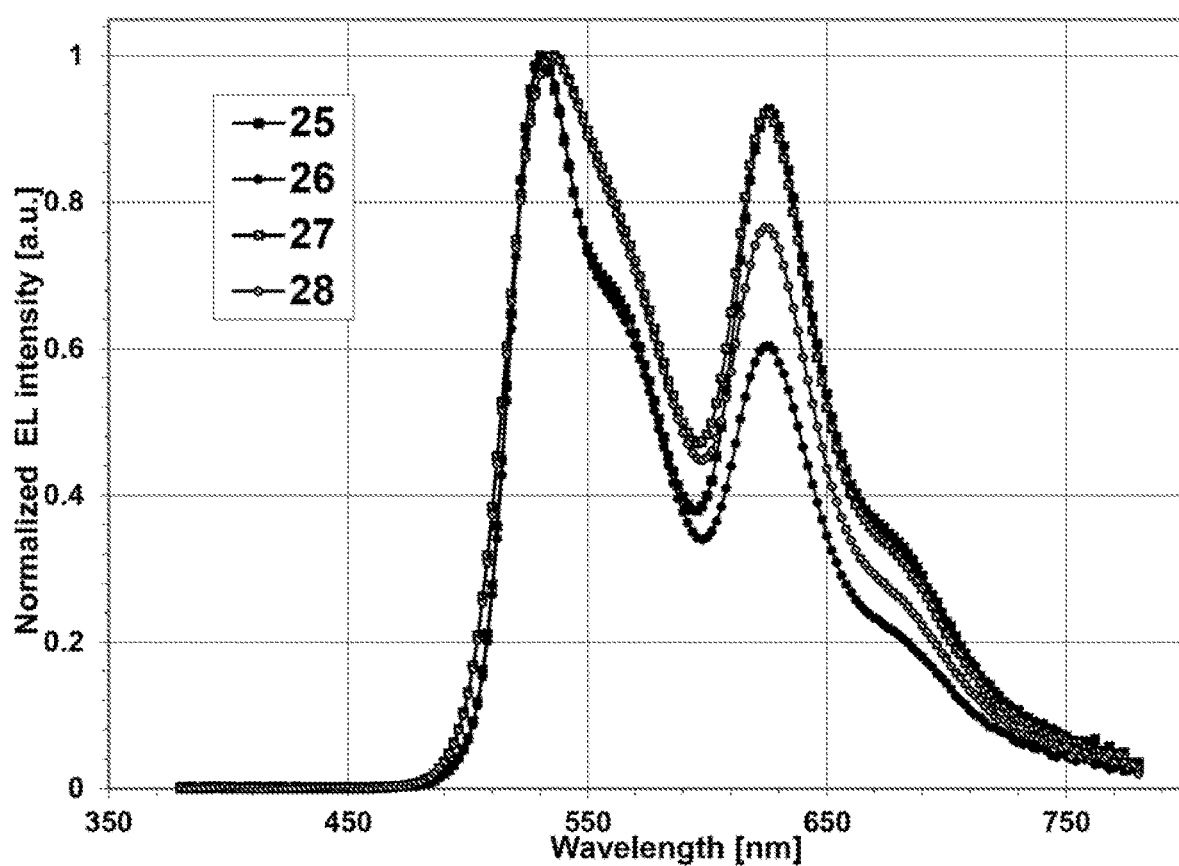
FIG. 9 shows normalized EL spectra for example R/G structures with H3 red cohost at various relative concentrations according to embodiments of the invention.

A device was also fabricated to demonstrate the effect of variation of the relative amount of cohosts in a red multicomponent emissive layer in a red/green structure as previously described. Table 6 shows the device layer thickness and materials, and Tables 7A and 7B show the structure variation and device performance. The normalized EL spectra are shown in FIG. 9.

In this example, it was found that an increase of the H3 cohost by percentage in the red EML improve color stability with current for both green emitters. That is, causing holes to move to the EML interface improves color stability.

Figure 12:
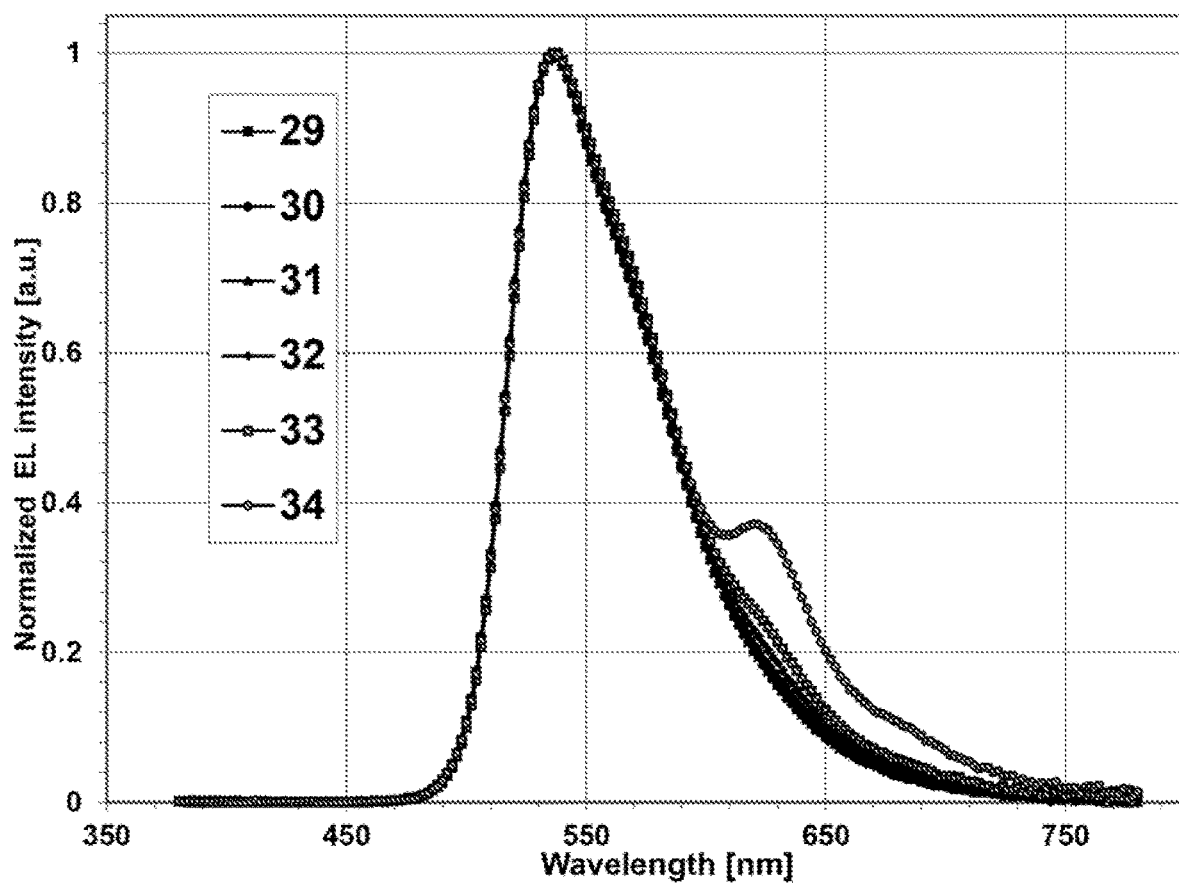
FIG. 12 shows normalized EL spectra for example G/R structures with G2 green emitter according an embodiments of the invention.

FIG. 10 shows the device structure for a green/red EML device and corresponding energy levels are shown in FIG. 11. The device materials and layer thicknesses are shown in Table 8 and structure variation and performance in Tables 9A and 9B. The normalized EL spectra are shown in FIG. 12.

TABLE 6

The device layer thickness and materials for R/G structures with H3 red cohost % variation:

| Layer | Material | Thickness [Å] |
|---|---|---|
| Anode | ITO | 750 |
| HIL | HAT-CN | 100 |
| HTL | HT | 450 |
| Red EML | H2:H3 18%, 35% R1 2% | 25 |
| Green EML | H1:H2 (3:2):G1, G2 10% | 375 |
| ETL | Liq:ETM 40% | 350 |
| EIL | Liq | 10 |
| Cathode | Al | 1,000 |

TABLE 8

The device layer thickness and materials for G/R structures with G2 green emitter:

| Layer | Material | Thickness [Å] |
|---|---|---|
| Anode | ITO | 750 |
| HIL | HAT-CN | 100 |
| HTL | HT | 450 |
| Green EML | H1:H2 (3:2):G2 15% | 100-350 |
| Red EML | H2:H3 18%:R1 2% | 300-50 |
| ETL | Liq:ETM 40% | 350 |
| EIL | Liq | 10 |
| Cathode | Al | 1,000 |

TABLE 7A

Device structure variation and performance for R/G structures with H3 red cohost % variation:

| Example | Red EML [Å] | H3 [%] | Green EML [Å] | G Emitter 10% | x | y | $\lambda$ max [nm] | FWHM [nm] | R/G Peak ratio |
|---|---|---|---|---|---|---|---|---|---|
| 25 | 25 | 18 | 375 | G1 | 0.450 | 0.532 | 531 | 65 | 0.93 |
| 26 | 25 | 35 | 375 | G1 | 0.422 | 0.559 | 531 | 64 | 0.60 |
| 27 | 25 | 18 | 375 | G2 | 0.446 | 0.535 | 535 | 77 | 0.92 |
| 28 | 25 | 35 | 375 | G2 | 0.435 | 0.545 | 535 | 75 | 0.77 |

TABLE 7B

Device structure variation and performance for R/G structures with H3 red cohost % variation:

| | At 10 mA/cm2 | | | At 80 mA/cm2 | | 100 vs. 1 mA/cm2 R/G ratio | | Aged vs. nonaged R/G ratio | |
|---|---|---|---|---|---|---|---|---|---|
| Example | Voltage [V] | LE [cd/A] | EQE [%] | Lo [nits] | $LT_{95\%}$ [h] | $\Delta$ u'v' | change [%] | $\Delta$ u'v' | change [%] |
| 25 | 5.0 | 43.2 | 18.5 | 24,482 | 78 | 0.026 | 65% | 0.007 | 88% |
| 26 | 4.7 | 51.7 | 19.2 | 30,375 | 99 | 0.016 | 72% | 0.004 | 91% |
| 27 | 4.7 | 50.9 | 20.6 | 28,145 | 75 | 0.003 | 96% | 0.002 | 97% |
| 28 | 4.5 | 55.2 | 21.3 | 31,949 | 123 | 0.000 | 102% | 0.001 | 99% |

TABLE 9A

Device structure variation and device performance for G/R with G2 green emitter device:

| Example | G EML [Å] | R EML [Å] | x | y | λ max [nm] | FWHM [nm] | R/G Peak ratio |
|---|---|---|---|---|---|---|---|
| 29 | 350 | 50 | 0.377 | 0.599 | 536 | 71 | 0.18 |
| 30 | 300 | 100 | 0.378 | 0.599 | 536 | 71 | 0.19 |
| 31 | 250 | 150 | 0.378 | 0.599 | 536 | 71 | 0.19 |
| 32 | 200 | 200 | 0.383 | 0.595 | 537 | 72 | 0.21 |
| 33 | 150 | 250 | 0.387 | 0.591 | 537 | 72 | 0.24 |
| 34 | 100 | 300 | 0.400 | 0.579 | 536 | 72 | 0.37 |

TABLE 9B

Device structure variation and device performance for G/R with G2 green emitter device:

| | At 10 mA/cm2 | | | At 80 mA/cm2 | | 100 vs. 1 mA/cm2 R/G ratio | | Aged vs. nonaged R/G ratio | |
|---|---|---|---|---|---|---|---|---|---|
| Example | Voltage [V] | LE [cd/A] | EQE [%] | Lo [nits] | $LT_{95\%}$ [h] | Δ u'v' | change [%] | Δ u'v' | change [%] |
| 29 | 4.5 | 75.8 | 20.8 | 46,217 | 96 | 0.003 | 92% | 0.000 | 113% |
| 30 | 4.5 | 77.8 | 21.4 | 46,769 | 107 | 0.003 | 91% | 0.000 | 92% |
| 31 | 4.5 | 76.7 | 21.3 | 45,570 | 88 | 0.003 | 99% | 0.000 | 103% |
| 32 | 4.4 | 78.3 | 21.9 | 47,009 | 78 | 0.003 | 109% | 0.000 | 90% |
| 33 | 4.5 | 76.4 | 21.8 | 45,388 | 75 | 0.002 | 110% | 0.000 | 107% |
| 34 | 4.5 | 68.4 | 21.3 | 40,052 | 54 | 0.003 | 99% | 0.000 | 102% |

In this example, it was found that most of the recombination zone was located in the green EML, close to the HTL. Unexpectedly, it was found that the device still produced predominantly green light, i.e., higher-energy emission, even with a device structure including a 150 Å green EML and a 250 Å red EML. In contrast, with conventional device configurations it would be expected that the larger red EML would result in predominantly red (lower-energy) emission.

Figure 15A:
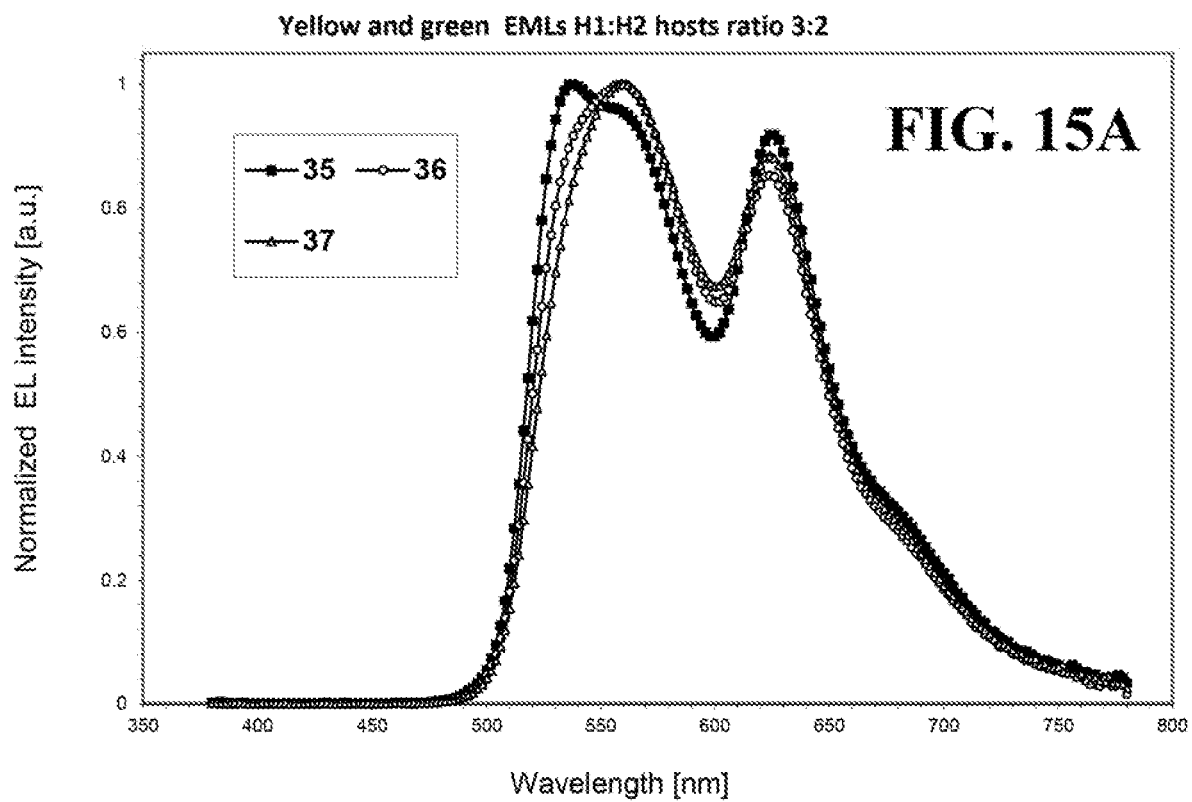
FIG. 15A shows a normalized EL spectrum of an example R/Y/G structure with various green/yellow EML H1:H2 hosts in ratios a ratio of 3:2 according to an embodiment of the invention.
Figure 15B:
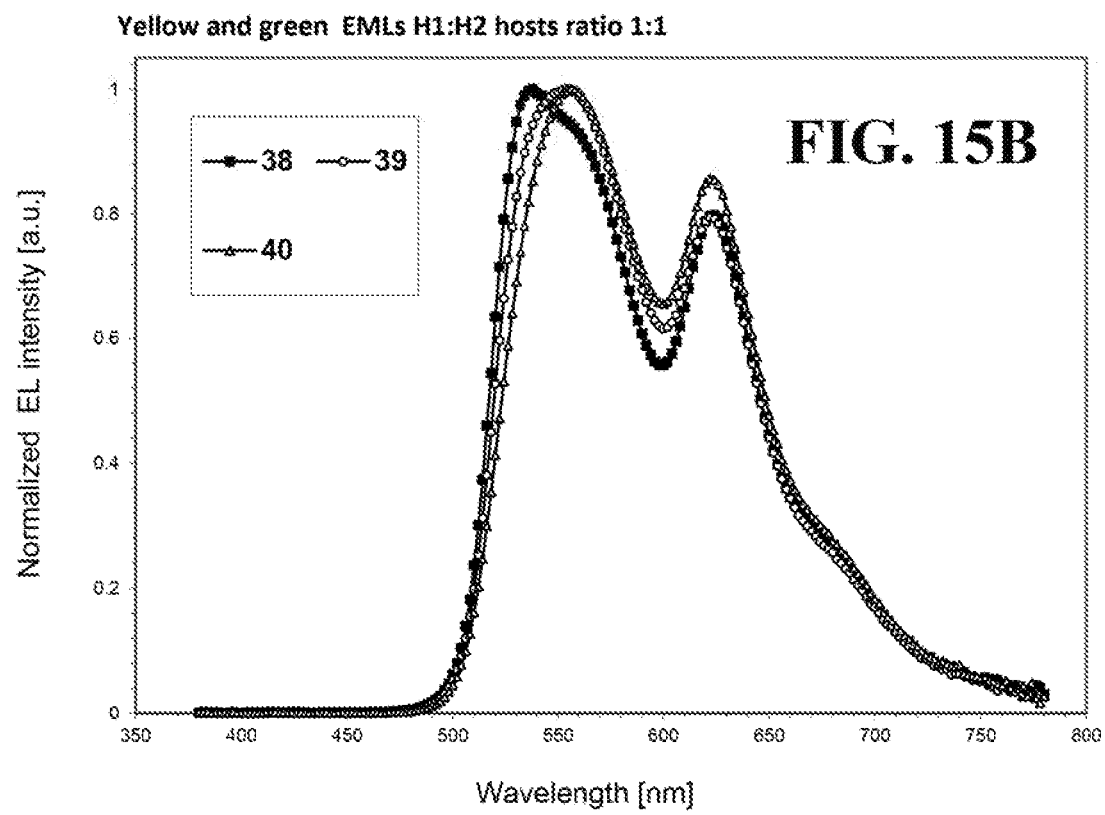
FIG. 15B shows a normalized EL spectrum of an example R/Y/G structure with various green/yellow EML H1:H2 hosts in a ratio of 1:1 according to an embodiment of the invention.

An example red/yellow/green multicomponent EML was fabricated according to the structure shown in FIG. 13. The corresponding energy level diagram is shown in FIG. 14. The device materials and layer thicknesses are shown in Table 10, and the structure variation and performance in Tables 11A and 11B. The normalized EL spectra are shown in FIGS. 15A and 15B.

TABLE 10

Device layer thickness and materials for R/Y/G structures:

| Layer | Material | Thickness [Å] |
|---|---|---|
| Anode | ITO | 750 |
| HIL | HAT-CN | 100 |
| HTL | HT | 450 |
| Red EML | H2:H3 35%:R1 2% | 25-50 |
| Yellow EML | H1:H2:Y1 12-15% | 50-150 |
| Green EML | H1:H2:G1 12% | 225-350 |
| ETL | Liq:ET 40% | 350 |
| EIL | Liq | 10 |
| Cathode | Al | 1,000 |

TABLE 11A

Device structure and performance for R/Y/G device structures:

| Example | Red EML [Å] | Yellow EML [Å] | Yellow EML H1:H2 ratio | Y1 [%] | Green EML [Å] | Green EML H1:H2 ratio | x | y | λ max [nm] | FWHM [nm] | R/G Peak ratio |
|---|---|---|---|---|---|---|---|---|---|---|---|
| 35 | 25 | 50 | 3:2 | 15 | 350 | 3:2 | 0.460 | 0.527 | 538 | 135 | 0.91 |
| 36 | 25 | 100 | 3:2 | 15 | 300 | 3:2 | 0.466 | 0.522 | 559 | 130 | 0.93 |
| 37 | 25 | 150 | 3:2 | 15 | 250 | 3:2 | 0.476 | 0.514 | 560 | 128 | 1.05 |
| 38 | 50 | 50 | 1:1 | 12 | 325 | 1:1 | 0.450 | 0.536 | 538 | 129 | 0.65 |
| 39 | 50 | 100 | 1:1 | 12 | 275 | 1:1 | 0.459 | 0.529 | 553 | 126 | 0.72 |
| 40 | 50 | 150 | 1:1 | 12 | 225 | 1:1 | 0.473 | 0.517 | 556 | 125 | 0.86 |

TABLE 11B

Device structure and performance for R/Y/G device structures:

| | At 10 mA/cm2 | | | At 80 mA/cm2 | | 100 vs. 1 mA/cm2 R/G ratio | | Aged vs. nonaged R/G ratio | |
|---|---|---|---|---|---|---|---|---|---|
| Example | Voltage [V] | LE [cd/A] | EQE [%] | Lo [nits] | LT95% [h] | Δ u'v' | change [%] | Δ u'v' | change [%] |
| 35 | 4.7 | 60.6 | 23.8 | 37,369 | 147 | 0.010 | 89% | 0.005 | 91% |
| 36 | 4.8 | 64.8 | 24.7 | 40,350 | 181 | 0.001 | 108% | 0.004 | 92% |
| 37 | 4.8 | 64.6 | 25.2 | 40,120 | 202 | 0.002 | 107% | 0.005 | 92% |
| 38 | 4.5 | 61.8 | 23.2 | 36,194 | 100 | 0.012 | 84% | 0.004 | 92% |
| 39 | 4.5 | 64.7 | 24.1 | 38,174 | 110 | 0.002 | 99% | 0.004 | 92% |
| 40 | 4.5 | 63.1 | 24.3 | 37,000 | 104 | 0.003 | 96% | 0.003 | 93% |

Figure 18:
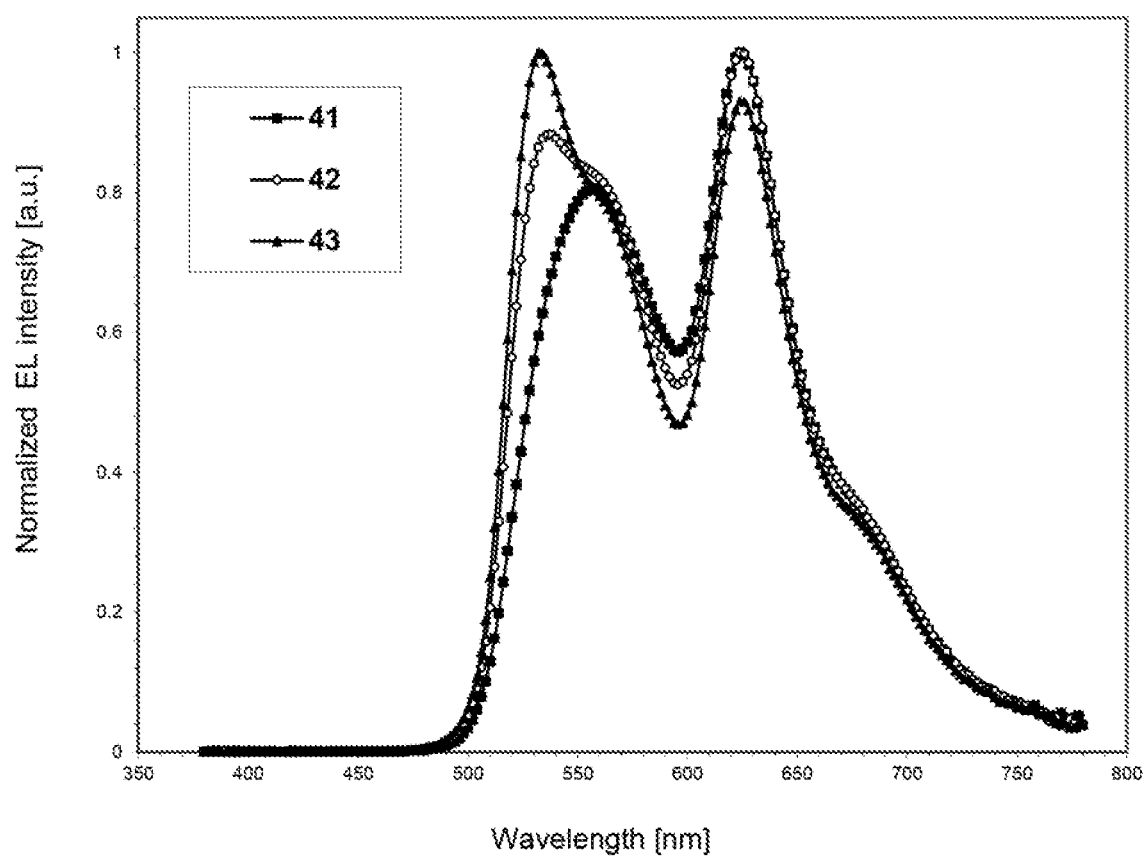
FIG. 18 shows normalized EL spectra of example R/G/Y structures according to embodiments of the invention.

FIG. 16 shows the example structure for a red/green/yellow device. The corresponding energy level diagram is shown in FIG. 19. The device materials and layer thicknesses are shown in Table 12, and structure variation and performance in Tables 13A and 13B. The normalized EL spectra are shown in FIG. 18.

TABLE 12

Device layer thickness and materials for R/G/Y structures:

| Layer | Material | Thickness [Å] |
|---|---|---|
| Anode | ITO | 750 |
| HIL | HAT-CN | 100 |
| HTL | HT | 450 |
| Red EML | H2:H3 35%:R1 2% | 25 |
| Green EML | H1:H2 (3:2):G1 12% | 50-150 |
| Yellow EML | H1:H2 (3:2):Y1 12% | 225-325 |
| ETL | Liq:ET 40% | 350 |
| EIL | Liq | 10 |
| Cathode | Al | 1,000 |

TABLE 13A

Device structure variation and device performance for R/G/Y devices

| Example | Green EML [Å] | Yellow EML [Å] | x | y | λ max [nm] | FWHM [nm] | R/G Peak ratio |
|---|---|---|---|---|---|---|---|
| 41 | 50 | 325 | 0.494 | 0.496 | 624 | 128 | 1.7 |
| 42 | 100 | 275 | 0.471 | 0.516 | 624 | 136 | 1.2 |
| 43 | 150 | 225 | 0.455 | 0.530 | 533 | 73 | 0.9 |

TABLE 13B

Device structure variation and device performance for R/G/Y devices

| | At 10 mA/cm2 | | | At 80 mA/cm2 | | 100 vs. 1 mA/cm2 R/G ratio | | Aged vs. nonaged R/G ratio | |
|---|---|---|---|---|---|---|---|---|---|
| Example | Voltage [V] | LE [cd/A] | EQE [%] | Lo [nits] | LT95% [h] | Δ u'v' | change [%] | Δ u'v' | change [%] |
| 41 | 4.9 | 52.0 | 23.0 | 29,818 | 101 | 0.037 | 53% | 0.005 | 92% |
| 42 | 4.9 | 52.6 | 22.3 | 30,472 | 82 | 0.036 | 55% | 0.002 | 97% |
| 43 | 4.8 | 53.6 | 22.0 | 30,931 | 81 | 0.031 | 59% | 0.004 | 93% |

As shown above, it was found that In R/Y/G and R/G/Y structures, the recombination zone is located predominantly next to the HTL. Accordingly, even a relatively thin 25-50 Å red EML provides sufficient red emission in the spectrum for many or most applications. In both structures, the ratio of G/Y peak can be tuned by changing the relative thickness of the green and yellow EMLs. It may be further fine tined by changing the hosts ratio and relative emitter concentrations. A comparison of the R/Y/G and R/G/Y structures and experimental data shows that the R/Y/G structure has better color stability than the R/G/Y structure. It is believe that this results from the mutual energy level alignment of the green and yellow emitters.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. A device comprising:
   a first emissive layer disposed between a first electrode and a second electrode, the first emissive layer comprising:
   a first host material,
   a second host material different than the first host material, wherein the highest occupied molecular orbital (HOMO) of the first host material is within 0.8 eV of the HOMO of the second host material, and
at least one component selected from the group consisting of:
a first emissive material, and
a second emissive material different than the first emissive material; and
a second emissive layer disposed between the first electrode and the second electrode and in direct physical contact with the first emissive layer, the second emissive layer comprising at least three components, each individually and uniquely selected from the group consisting of:
a third host material,
a fourth host material different than the third host material,
a third emissive material, and
a fourth emissive material different than the third emissive material.

2. The device of claim 1, wherein the first emissive layer has a thickness of not more than 30% of the thickness of the second emissive layer.

3. The device of claim 1, wherein the LUMO of the first host material is within 0.8 eV of the LUMO of the second host material.

4. The device of claim 1, wherein:
the first emissive layer comprises:
the first emissive material; and
the second emissive layer comprises:
the third host material;
the fourth host material, wherein the fourth host material is different than the third host material; and
the second emissive material;
wherein the third host material is different than the first host material.

5. The device of claim 4, wherein the fourth host material is different than the second host material.

6. The device of claim 4, wherein the second emissive layer comprises:
the third host material, wherein the third host material comprises the first host material;
the fourth host material, wherein the fourth host material comprises the second host material; and
the second emissive material;
wherein the relative concentration of host materials is different in the first emissive layer than in the second emissive layer.

7. The device of claim 4, wherein the third organic emissive material comprises the first emissive material.

8. The device of claim 1, wherein:
the first emissive layer comprises:
the first emissive material; and
the second emissive material, wherein the second emissive material is different than the first emissive material; and
the second emissive layer comprises:
the third host material;
the third emissive material; and
the fourth emissive material, wherein the fourth emissive material is different than the third emissive material;
wherein the third emissive material is different than the first emissive material.

9. The device of claim 8, wherein the fourth emissive material is different than the second emissive material.

10. The device of claim 8, wherein the third host material comprises the first host material.

11. The device of claim 1, wherein:
the first emissive layer comprises:
a red organic emissive material; and
the second emissive layer comprises:
the third host material, wherein the third host material comprises the first host material;
the fourth host material; and
a green organic or organometallic emissive material; and
wherein the first emissive layer has a thickness of not more than 30% of the second emissive layer.

12. The device of claim 1, further comprising a third emissive layer, the third emissive layer comprising at least three components, each independently selected from the group consisting of: a fifth host material, a sixth host material, a fifth emissive material, and a sixth emissive material.

13. The device of claim 12, wherein the fifth host material comprises the first host material, and the sixth host material comprises the second host material.

14. The device of claim 1, wherein the first emissive layer comprises the first host material and the second host material in a ratio in the range of 5-95%.

15. The device of claim 14, wherein the first emissive layer comprises the first host material and the second host material in a ratio in the range of 5-50%.

16. The device of claim 1, wherein the first emissive layer comprises the first host material and the second host material in a ratio in the range of 30-40%.

17. The device of claim 1, wherein the first emissive layer comprises the first emissive material and the second emissive material in a ratio in the range of 1-25%.

18. The device of claim 1, wherein the first emissive layer comprises the first emissive material and the second emissive material in a ratio in the range of 0.1-10%.

19. The device of claim 1, wherein the first emissive layer comprises the first emissive material and the second emissive layer comprises the third emissive material, wherein the ratio of the first emissive material to the third emissive material is in in the range of 5 to 30%.

20. A device comprising:
a first emissive layer disposed between a first electrode and a second electrode, the first emissive layer comprising:
a first host material,
a second host material different than the first host material, wherein the lowest unoccupied molecular orbital (LUMO) of the first host material is within 0.8 eV of the LUMO of the second host material, and
at least one component selected from the group consisting of:
a first emissive material, and
a second emissive material different than the first emissive material; and
a second emissive layer disposed between the first electrode and the second electrode and in direct physical contact with the first emissive layer, the second emissive layer comprising at least three components, each individually and uniquely selected from the group consisting of:
a third host material,
a fourth host material different than the third host material,
a third emissive material, and
a fourth emissive material different than the third emissive material.

21. The device of claim 20, wherein the first emissive layer has a thickness of not more than 30% of the thickness of the second emissive layer.

22. The device of claim 20, wherein:
the first emissive layer comprises the first emissive material; and
the second emissive layer comprises:
the third host material;
the fourth host material, wherein the fourth host material is different than the third host material; and
the second emissive material;
wherein the third host material is different than the first host material.

23. The device of claim 22, wherein the fourth host material is different than the second host material.

24. The device of claim 22, wherein the second emissive layer comprises:
the third host material, wherein the third host material comprises the first host material;
the fourth host material, wherein the fourth host material comprises the second host material; and
the second emissive material;
wherein the relative concentration of host materials is different in the first emissive layer than in the second emissive layer.

25. The device of claim 22, wherein the third organic emissive material comprises the first emissive material.

26. The device of claim 20, wherein:
the first emissive layer comprises:
the first emissive material; and
the second emissive material, wherein the second emissive material is different than the first emissive material; and
the second emissive layer comprises:
the third host material;
the third emissive material; and
the fourth emissive material, wherein the fourth emissive material is different than the third emissive material;
wherein the third emissive material is different than the first emissive material.

27. The device of claim 26, wherein the fourth emissive material is different than the second emissive material.

28. The device of claim 26, wherein the third host material comprises the first host material.

29. The device of claim 20, wherein:
the first emissive layer comprises a red organic emissive material; and
the second emissive layer comprises:
the third host material, wherein the third host material comprises the first host material;
the fourth host material; and
a green organic or organometallic emissive material; and
wherein the first emissive layer has a thickness of not more than 30% of the second emissive layer.

30. The device of claim 20, further comprising a third emissive layer, the third emissive layer comprising at least three components, each independently selected from the group consisting of: a fifth host material, a sixth host material, a fifth emissive material, and a sixth emissive material.

31. The device of claim 30, wherein the fifth host material comprises the first host material, and the sixth host material comprises the second host material.

32. The device of claim 20, wherein the first emissive layer comprises the first host material and the second host material in a ratio in the range of 5-95%.

33. The device of claim 32, wherein the first emissive layer comprises the first host material and the second host material in a ratio in the range of 5-50%.

34. The device of claim 32, wherein the first emissive layer comprises the first host material and the second host material in a ratio in the range of 30-40%.

35. The device of claim 20, wherein the first emissive layer comprises the first emissive material and the second emissive material in a ratio in the range of 1-25%.

36. The device of claim 20, wherein the first emissive layer comprises the first emissive material and the second emissive material in a ratio in the range of 0.1-10%.

37. The device of claim 20, wherein the first emissive layer comprises the first emissive material and the second emissive layer comprises the third emissive material, wherein the ratio of the first emissive material to the third emissive material is in in the range of 5 to 30%.

* * * * *